(12) United States Patent
Cho et al.

(10) Patent No.: US 8,795,541 B2
(45) Date of Patent: Aug. 5, 2014

(54) SUBSTRATE PROCESSING METHOD AND SUBSTRATE PROCESSING SYSTEM FOR PERFORMING THE SAME

(75) Inventors: Yong-Jhin Cho, Suwon-si (KR); Kun-Tack Lee, Suwon-si (KR); Hyo-San Lee, Suwon-si (KR); Young-Hoo Kim, Hwaseong-si (KR); Jung-Won Lee, Gunpo-si (KR); Sang-Won Bae, Incheon (KR); Jung-Min Oh, Incheon (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 76 days.

(21) Appl. No.: 13/314,791

(22) Filed: Dec. 8, 2011

(65) Prior Publication Data

US 2012/0152898 A1 Jun. 21, 2012

(30) Foreign Application Priority Data

Dec. 16, 2010 (KR) .................. 10-2010-0128776

(51) Int. Cl.
*H01L 21/66* (2006.01)
*H01L 21/02* (2006.01)

(52) U.S. Cl.
CPC ......... *H01L 21/02104* (2013.01); *H01L 22/00* (2013.01)
USPC ............................................. 216/59; 438/14

(58) Field of Classification Search
None
See application file for complete search history.

(56) References Cited

U.S. PATENT DOCUMENTS

| | | | |
|---|---|---|---|
| 2004/0010380 A1 | 1/2004 | Kim | |
| 2004/0168709 A1* | 9/2004 | Drumm et al. | 134/18 |
| 2004/0175958 A1* | 9/2004 | Lin et al. | 438/778 |
| 2008/0029159 A1 | 2/2008 | Lee et al. | |
| 2008/0251104 A1 | 10/2008 | Chen et al. | |
| 2009/0206037 A1* | 8/2009 | Shaimi | 210/639 |
| 2009/0273780 A1* | 11/2009 | Tomaru et al. | 356/301 |
| 2010/0006753 A1* | 1/2010 | Schroeder | 250/288 |

FOREIGN PATENT DOCUMENTS

| | | |
|---|---|---|
| KR | 10-0515721 | 9/2005 |
| KR | 10-0744145 | 8/2007 |
| KR | 10-2008-0059619 | 6/2008 |
| KR | 10-0938244 | 1/2010 |

OTHER PUBLICATIONS

English Abstract for Publication No. 10-2009-0074453 (for 10-093824), Jan. 22, 2010.
English Abstract for Publication No. 10-2008-0059619, Jun. 30, 2008.
English Abstract for Publication No. 10-2004-0007866 (for 10-0515721), Sep. 16, 2005.
English Abstract for Publication No. 10-0744145, Aug. 1, 2007.

* cited by examiner

*Primary Examiner* — Shamim Ahmed
*Assistant Examiner* — Bradford Gates
(74) *Attorney, Agent, or Firm* — F. Chau & Associates, LLC

(57) ABSTRACT

In a supercritical fluid method a supercritical fluid is supplied into a process chamber. The supercritical fluid is discharged from the process chamber as a supercritical fluid process proceeds. A concentration of a target material included in the supercritical fluid discharged from the process chamber is detected during the supercritical fluid process. An end point of the supercritical fluid process may be determined based on a detected concentration of the target material.

11 Claims, 13 Drawing Sheets

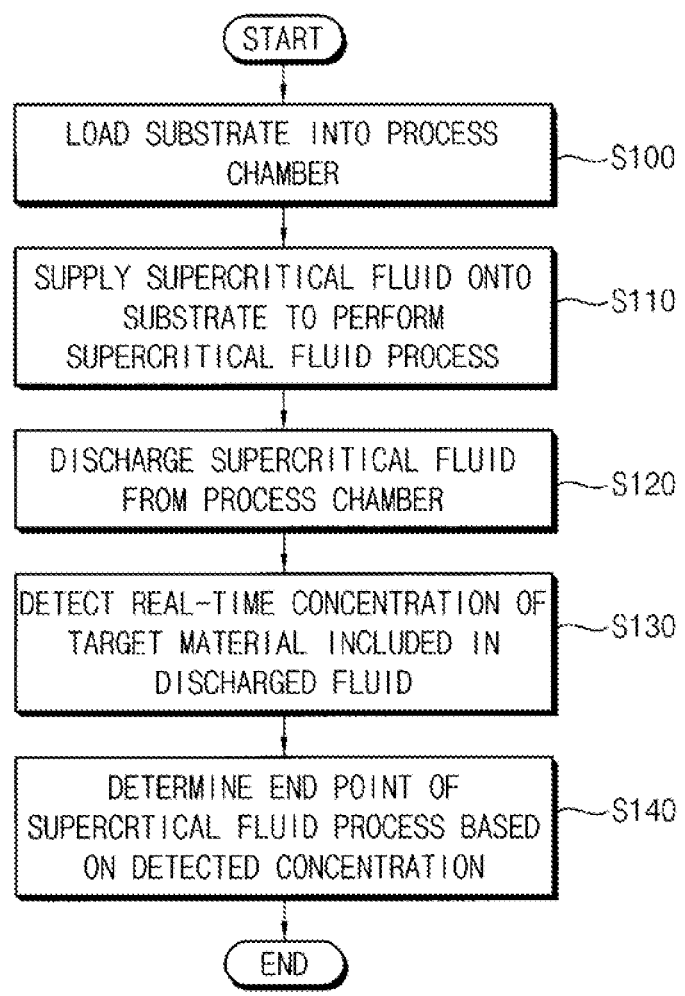

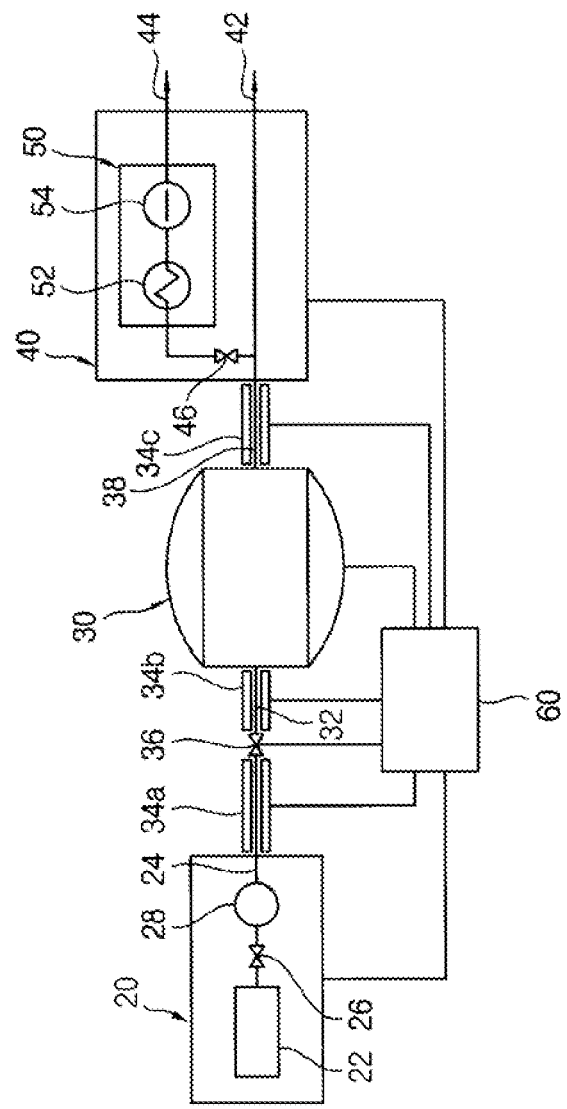

SUBSTRATE PROCESSING METHOD AND SUBSTRATE PROCESSING SYSTEM FOR PERFORMING THE SAME

CROSS-REFERENCE TO RELATED APPLICATIONS

This application claims priority under 35 U.S.C. §119 to Korean Patent Application No. 10-2010-0128776, filed on Dec. 16, 2010 in the Korean Intellectual Property Office (KIPO), the content of which is herein incorporated by reference in its entirety.

BACKGROUND

1. Technical Field

The present disclosure relates to a substrate processing method and a substrate processing system for performing the same, and more particularly to a method of processing a substrate using a supercritical fluid and a substrate processing system for performing the same.

2. Description of Related Art

In the field of integrated semiconductor device manufacture, a supercritical fluid may be used to physically and chemically process fine semiconductor patterns.

A supercritical fluid is any substance at a temperature and pressure above its critical point, where distinct liquid and gas phases do not exist. The supercritical fluid may have unique properties as compared to a gas and a liquid, including low surface tension, low viscosity, high solvency, and high diffusion coefficient with applications in the field of integrated semiconductor device manufacture.

SUMMARY

According to an exemplary embodiment of the present disclosure, in a supercritical fluid method a supercritical fluid is supplied into a process chamber. The supercritical fluid is discharged from the process chamber as a supercritical fluid process proceeds. A concentration of a target material included in the supercritical fluid discharged from the process chamber is detected during the supercritical fluid process.

In an exemplary embodiment, an end point of the supercritical fluid process is determined based on a detected concentration of the target material.

In an exemplary embodiment, detecting the concentration of the target material may include heating the supercritical fluid discharged from the process chamber to maintain the supercritical fluid in a gas phase and detecting the concentration of the target material in the gas phase included in the supercritical fluid discharged from the process chamber.

In an exemplary embodiment, detecting the concentration of the target material may include condensing the supercritical fluid discharged from the process chamber to liquid phase and detecting the concentration of the target material in the liquid phase included in the supercritical fluid discharged from the process chamber.

In an exemplary embodiment, detecting the concentration of the target material in the liquid phase may include mixing the target material in the liquid phase with a reference liquid and detecting a relative concentration of the target material in the liquid phase with respect to the reference liquid.

In an exemplary embodiment, the method may further include controlling a system including the process chamber to complete the supercritical fluid process after determining the end point of the supercritical fluid process.

In an exemplary embodiment, the method may further include loading a substrate into the process chamber.

In an exemplary embodiment, the method may further include controlling a flow rate of the supercritical fluid to a detection unit detecting the concentration of the target material.

In an exemplary embodiment, the method may further include detecting a concentration of the target material in the process chamber during the supercritical fluid process.

According to an exemplary embodiment of the present disclosure, a processing system includes a process chamber, a supply unit configured to supply a supercritical fluid to the process chamber, a discharge unit configured to discharge the supercritical fluid from the process chamber, and a detection unit provided in the discharge unit, and configured to detect a concentration of a target material included in the supercritical fluid discharged from the process chamber during a supercritical fluid process.

In an exemplary embodiment, the detection unit is configured to determine an end point of the supercritical fluid process based on a detected concentration of the target material.

In an exemplary embodiment, the detection unit may include a heater for heating the supercritical fluid discharged from the process chamber to maintain in a gas phase and a detector for detecting the concentration of the target material in the gas phase included in the supercritical fluid discharged from the process chamber.

In an exemplary embodiment, the detection unit may include a condenser for condensing the supercritical fluid discharged from the process chamber to a liquid phase and a detector for detecting the concentration of the target material in the liquid phase included in the supercritical fluid discharged from the process chamber.

In an exemplary embodiment, the detection unit may further include a mixer for mixing the supercritical fluid discharged from the process chamber with a reference liquid, and the detector may detect a relative concentration of the target material in the liquid phase with respect to the reference liquid.

In an exemplary embodiment, the processing system may further include a control unit connected to the process chamber, the supply unit and the discharge unit, to determine the end point of the supercritical fluid process and control operations of the processing system.

In an exemplary embodiment, the processing system may further include a valve to control a flow rate of the supercritical fluid to the detection unit.

In an exemplary embodiment, the processing system may further include a chamber detector to detect a concentration of the target material in the process chamber.

In an exemplary embodiment, wherein the discharge unit further comprises at least two discharge pipes, wherein at least one of the two discharge pipes is connected to the detection unit.

Accordingly, a concentration of a target material in the discharged fluid may be detected and analyzed to check the progress of the process and determine the end point of the supercritical fluid process. After determining the end point of the supercritical fluid process, a system including the process chamber may be controlled to complete the supercritical fluid process.

BRIEF DESCRIPTION OF THE DRAWINGS

Embodiments of the present disclosure will be more clearly understood from the following detailed description taken in conjunction with the accompanying drawings. FIGS. 1 to 13 represent non-limiting, exemplary embodiments as described herein.

FIG. 1 is a flowchart illustrating a substrate processing method in accordance with exemplary embodiments of the present disclosure.

FIG. 2 is a block diagram illustrating a substrate processing system in accordance with an exemplary embodiment of the present disclosure.

FIG. 4 is a block diagram illustrating a substrate processing system in accordance with an exemplary embodiment of the present disclosure.

FIG. 5 is a graph illustrating concentration changes of a target material versus a process time detected by the detection unit in FIG. 4.

FIG. 6 is a block diagram illustrating a substrate processing system in accordance with an exemplary embodiment of the present disclosure.

FIG. 7 is a block diagram illustrating a substrate processing system in accordance with an exemplary embodiment of the present disclosure.

FIGS. 8 to 13 are cross-sectional views illustrating a method of manufacturing a semiconductor device using a substrate process method in accordance with an exemplary embodiment of the present disclosure.

DETAILED DESCRIPTION OF EXEMPLARY EMBODIMENTS

Figure 3A:
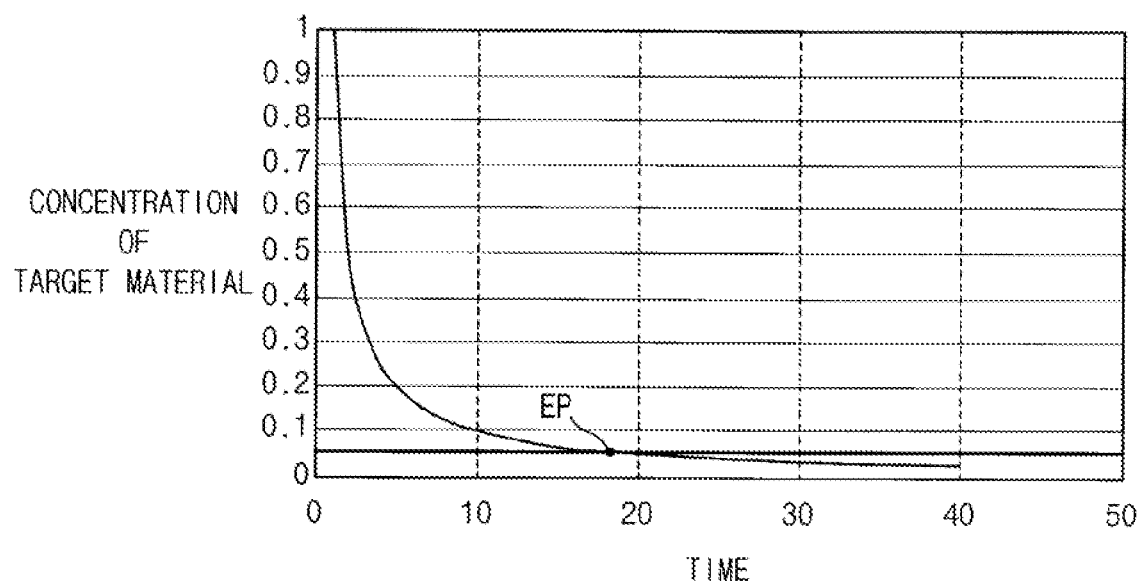
FIGS. 3A and 3B are graphs illustrating concentration changes of a target material versus a process time detected by the detection unit in FIG. 2.

Various exemplary embodiments will be described more fully hereinafter with reference to the accompanying drawings, in which exemplary embodiments are shown. Embodiments of the present disclosure may, however, be embodied in many different forms and should not be construed as limited to exemplary embodiments set forth herein. Rather, exemplary embodiments are provided so that this disclosure will be thorough and complete, and will fully convey the scope of exemplary embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments will be explained in detail with reference to the accompanying drawings.

FIG. 1 is a flowchart illustrating a substrate processing method in accordance with exemplary embodiments of the present disclosure.

Referring to FIG. 1, a substrate may be loaded into a process chamber (S100). The process chamber may provide a space for performing a supercritical fluid process on the substrate.

In exemplary embodiments, the process chamber may include a temperature and pressure control device for controlling a temperature and a pressure inside the process chamber to provide a supercritical condition for a supercritical fluid process. Accordingly, the substrate may be loaded into the process chamber such that a supercritical fluid process is performed on a material layer formed on the substrate.

It should be noted that the present disclosure is not limited to methods wherein a substrate is loaded into the process chamber. For example, a supercritical fluid process may be performed to clean a process chamber without a substrate being disposed therein.

A supercritical fluid may be supplied to the process chamber to perform a supercritical fluid process (S110), and the supercritical fluid may be subsequently discharged from the process chamber (S120).

A supercritical fluid is any substance at a temperature and pressure above its critical point, where distinct liquid and gas phases do not exist. A supercritical fluid may have unique properties as compared to a gas and a liquid including low surface tension, low viscosity, high solvency and high diffusion coefficient. According to an exemplary embodiment of the present disclosure, a supercritical fluid process may be applied to manufactures of semiconductor devices using a supercritical fluid.

Table. 1 shows the critical properties for some substances, which may be used as supercritical fluids.

TABLE 1

Critical properties of various solvents.

| solvent | chemical formula | boiling point (° C.) | freezing point (° C.) | critical temperature (° C.) | critical pressure (atm) | Density (g/cm$^3$) |
|---|---|---|---|---|---|---|
| ammonia | $NH_3$ | −33.4 | −77.7 | 132 | 111.3 | 0.24 |
| carbon dioxide | $CO_2$ | −56.6 | −78.5 | 31 | 72.8 | 0.47 |
| ethane | $C_2H_6$ | −88.6 | −183.3 | 32 | 48.2 | 0.20 |
| propane | $C_3H_8$ | −42.1 | −189.7 | 97 | 41.9 | 0.22 |
| sulfur hexafluoride | $SF_6$ | −50.5 | −63.8 | 45 | 37.1 | 0.74 |
| water | $H_2O$ | 100.0 | 0.0 | 374 | 217.7 | 0.32 |

In an exemplary embodiment, the supercritical fluid process may be a drying process for drying the substrate using a supercritical fluid. For example, after a material layer on a substrate is etched using an etching mask and is cleaned using a cleaning solution, the substrate may be dried using a supercritical fluid. In one example the material layer may include a silicon oxide such as BPSG (boro-phospho silicate glass), TEOS (tetraethyl orthosilicate). The cleaning solution may include DI water or alcohol such as IPA (iso propyl alcohol). The supercritical fluid may include supercritical carbon dioxide. Different material layers may be used and the present disclosure is not limited to those described herein. The cleaning solution may be selected based on the material layer.

In an exemplary embodiment, supercritical carbon dioxide may be supplied onto the substrate to perform a supercritical drying process for drying the substrate. As the drying process proceeds, the supercritical fluid may be used and discharged from the process chamber. The discharged fluid may include IPA as a target material (e.g., a material used in a current process), and the discharged fluid may be discharged with the supercritical fluid from the process chamber.

In another exemplary embodiment, the supercritical fluid process may be a cleaning process that cleans the substrate using a supercritical fluid. For example, after a material layer on a substrate is etched using an etching mask, the substrate may be cleaned using a supercritical fluid including a cleaning solution. In one example, supercritical carbon dioxide with surfactant dissolved therein may be supplied onto the substrate to perform a supercritical cleaning process for cleaning the substrate. As the cleaning process proceeds, the supercritical fluid may be used and discharged from the process chamber. The discharged fluid may include a target material (e.g., a cleaning solution and a material removed by the etching process), and the target material may be discharged with the supercritical fluid from the process chamber.

In still another exemplary embodiment, the supercritical fluid process may be an etching process that etches a material layer on the substrate using a supercritical fluid. For example, supercritical carbon dioxide with fluoride, such as hydrogen fluoride (HF), included therein may be supplied onto the substrate to perform a supercritical etching process for etching the material layer on the substrate. As the etching process proceeds, the supercritical fluid may be used and discharged from the process chamber. The discharged fluid may include a target material (e.g., an etchant), and the target material may be discharged with the supercritical fluid from the process chamber.

A real-time concentration of a target material included in the fluid discharged from the process chamber may be detected (S130), and an end point (EP) of the supercritical fluid process may be determined based on a detected concentration of the target material (S140).

In exemplary embodiments, the fluid discharged from the process chamber may include a target material indicative of the progress of the supercritical fluid process. Accordingly, a real-time concentration of the target material included in the fluid discharged from the process chamber may be detected to determine an end point of the supercritical fluid process based on the detected concentration.

For example, the discharged fluid may be heated to be in a gas phase and a concentration of the target material of a gas phase (target gas) included in the discharged fluid may be detected.

Alternatively, the discharged fluid may be condensed to be in a liquid phase and a concentration of the target material of a liquid phase (target liquid) included in the discharged fluid may be detected. In this case, the target liquid may be mixed with a reference liquid and a relative concentration of the target liquid with respect to the reference liquid may be detected.

In exemplary embodiments, a concentration of a target material in the discharged fluid may be detected and analyzed in real time, to check the progress of the process and determine the end point of the supercritical fluid process. After determining the end point of the supercritical fluid process, a system including the process chamber may be controlled to complete the supercritical fluid process, to thereby improve reliability of the process.

Hereinafter, a substrate processing system for performing a substrate processing method of FIG. 1 will be explained in detail.

FIG. 2 is a block diagram illustrating a substrate processing system 10 in accordance with an exemplary embodiment of the present disclosure.

Referring to FIG. 2, a substrate processing system 10 according to a first exemplary embodiment includes a supply unit 20, a process chamber 30, a discharge unit 40, a detection unit 50 and a control unit 60.

The process chamber 30 may provide a space for processing a substrate. The process chamber 30 may include a temperature and pressure control device for controlling a temperature and a pressure inside the process chamber 30 to provide a supercritical condition for a supercritical fluid process. A substrate including a material layer formed thereon may be loaded into the process chamber 30. The supply unit 20 and the discharge unit 40 may be connected to the process chamber 30 by a plurality of pipes 24, 32, 38.

The supply unit 20 may supply a supercritical fluid source to the process chamber 30. A supercritical fluid may be supplied onto the substrate in the process chamber 30 to perform a supercritical fluid process. The supercritical fluid may be discharged from the process chamber 30 to the discharge unit 40.

The supply unit 20 may include at least one container 22 for storing a solvent. The supply unit 20 may include one or more additional containers (not illustrated) for storing a co-solvent such as an etching material or a cleaning material corresponding to a desired process. The etching material may include, for example, fluoride such as hydrogen fluoride (HF), and the cleaning material may include DI (de-ionized) water, surfactant, alcohol, etc.

The supply unit 20 may include a pressure pump 28 configured to pressurize a solvent from the container 22 and to supply the supercritical fluid source to the process chamber 30. The supercritical fluid may be supplied in a supercritical state from the supply unit 20 into the process chamber 30 through a plurality of temperature control jackets 34a and 34b and may be transferred from the process chamber 30 to the discharge unit 40 through a another temperature control jacket 34c. A plurality of valves 26, 36, and 46 may be provided to control the flow rate of the fluid through the pipes.

The detection unit 50 may be provided in the discharge unit 40 to detect a concentration of a target material included in the fluid discharged from the process chamber 30. The detection may be performed in real time during a process in the process chamber.

In an exemplary embodiment of the present disclosure, the discharge unit 40 may include a main discharge pipe 42 and an auxiliary discharge pipe 44. A portion of the fluid may be discharged from the process chamber 30 through the main discharge pipe 42 and another portion of fluid may be discharged from the process chamber 30 through the auxiliary discharge pipe 44.

The detection unit 50 may be disposed at the auxiliary discharge pipe 44 to detect a real-time concentration of a target material included in the discharged fluid. A discharge valve 46 may be provided at the auxiliary discharge pipe 44 to control the flow rate of the fluid to the detection unit 50.

The discharge unit 40 may include a separator (not illustrated) that separates specific chemicals from the solvent of the discharged fluid. The fluid may be circulated from the separator to the system through a circulation pipe (not illustrated).

The detection unit 50 may include a heater 52 for heating the discharged fluid to maintain a gas phase thereof and a detector 54 for detecting a concentration of a target material of the gas phase (target gas) included in the discharged fluid. Accordingly, the detection unit 50 may detect a real-time concentration of a target gas included in the discharged fluid.

The detector 54 may have various analyzers corresponding to a target material. Examples of the detector 54 may include an RGA (residual gas analyzer), an HF detector, an IPA detector, a hygrometer, etc.

The control unit 60 may be connected to the process chamber 30, the supply unit 20, and the discharge unit 40, to determine an end point of the supercritical fluid process and control operations of the system.

Figure 3B:
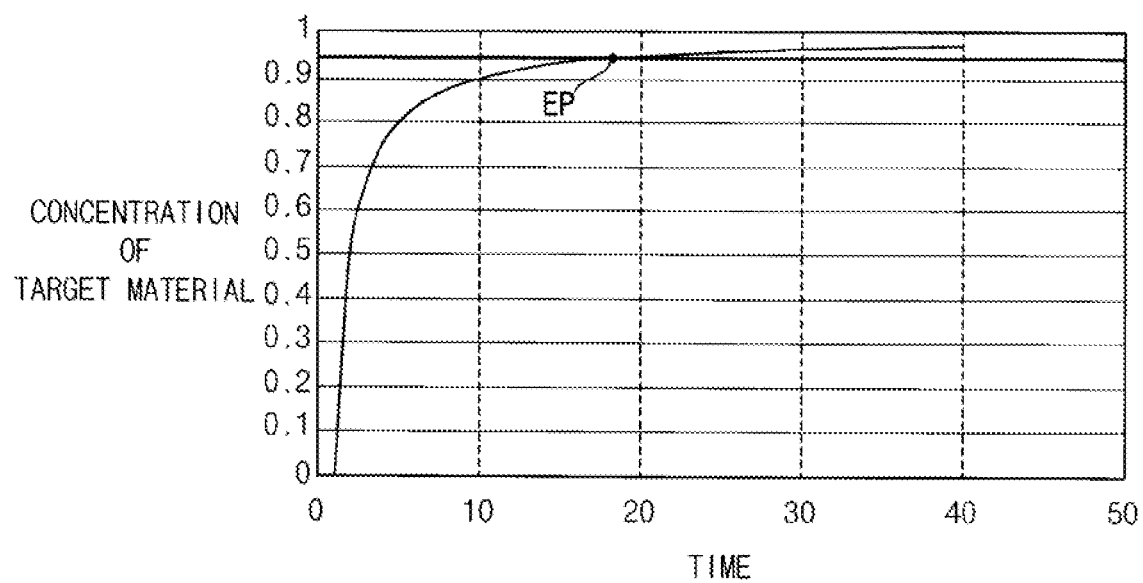

FIGS. 3A and 3B are graphs illustrating exemplary concentration changes of a target material versus a process time detected by the detection unit in FIG. 2.

Referring to FIG. 3A, a concentration of the target material detected by the detection unit in FIG. 2 may decrease with time. For example, as the process proceeds, a discharged reactant (target material) may decrease. Accordingly, a time when a normalized concentration of the target material decreases to a predetermined concentration (for example, 0.05%) may be determined as an end point (EP) of the process.

Referring to FIG. 3B, a concentration of the target material detected by the detection unit in FIG. 2 may increase with time. For example, as the process proceeds, a discharged supercritical fluid (e.g., gas supplied to the process chamber) as a target material may increase while a discharged reactant decreases. Accordingly, a time when a normalized concentration of the target material increases to a predetermined concentration (for example, 0.95%) may be determined as an end point of the process.

Thus, a concentration of a target material in the discharged fluid may be detected and analyzed in real time, to check the progress of the process and determine the end point of the supercritical fluid process. After determining the end point of the supercritical fluid process, the system including the process chamber may be controlled to complete the supercritical fluid process.

Figure 4:
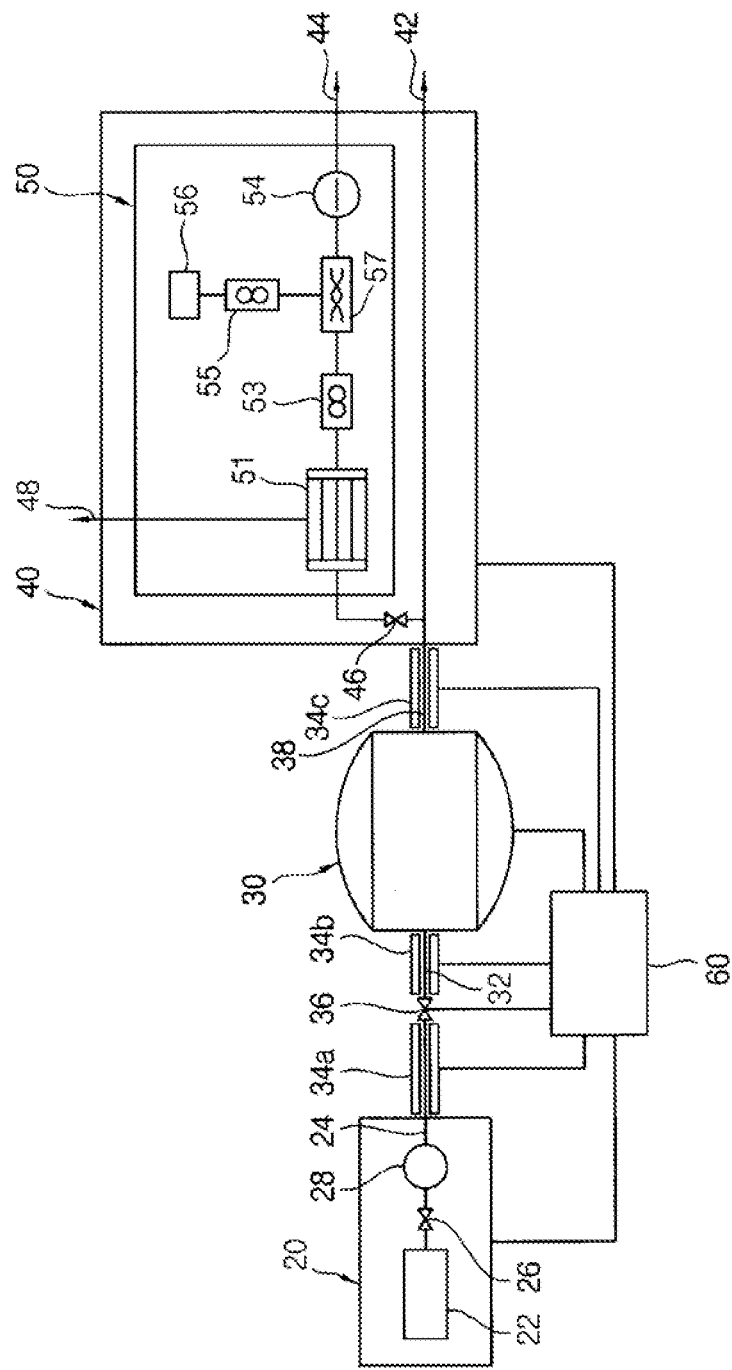

FIG. 4 is a block diagram illustrating a substrate processing system 11 in accordance with an exemplary embodiment of the present disclosure. FIG. 4 is substantially the same as FIG. 2 with the exception of the detection unit. Thus, the same reference numerals will be used to refer to the same or like elements as those described with reference to FIG. 2 and any further explanation thereof will be omitted.

Referring to FIG. 4, a detection unit 50 of a substrate processing system 11 according to an exemplary embodiment of the present disclosure may include a condenser 51 for condensing the discharged fluid to a liquid phase and a detector 54 for detecting a concentration of a target material (target liquid) included in the discharged fluid in the liquid phase.

The condenser 51 may be disposed at the auxiliary discharge pipe 44 to condense the fluid discharged from the process chamber 30 to a liquid phase. The fluid of a liquid phase may be circulated from the condenser 51 to the supply unit 20 of the system through a circulation pipe 48.

In an exemplary embodiment, the detection unit 50 may further include a mixer 57 for mixing a reference liquid with the target liquid discharged from the condenser 51. The mixer 57 may be provided between the condenser 51 and a detector 54.

A reference liquid supply unit 56 may supply the reference liquid to the mixer 57. A first flowmeter 53 may be disposed between the condenser 51 and the mixer 57 to detect a flow rate of the target liquid. A second flowmeter 55 may be disposed between the reference liquid supply unit 56 and the mixer 57 to detect a flow rate of the reference liquid. For example, as a supercritical fluid process proceeds, a flow rate of the reference fluid may be kept constant while a flow rate of the target liquid may decrease. Accordingly, the detector 54 may detect a relative concentration of the target liquid with respect to the reference liquid.

Figure 5:
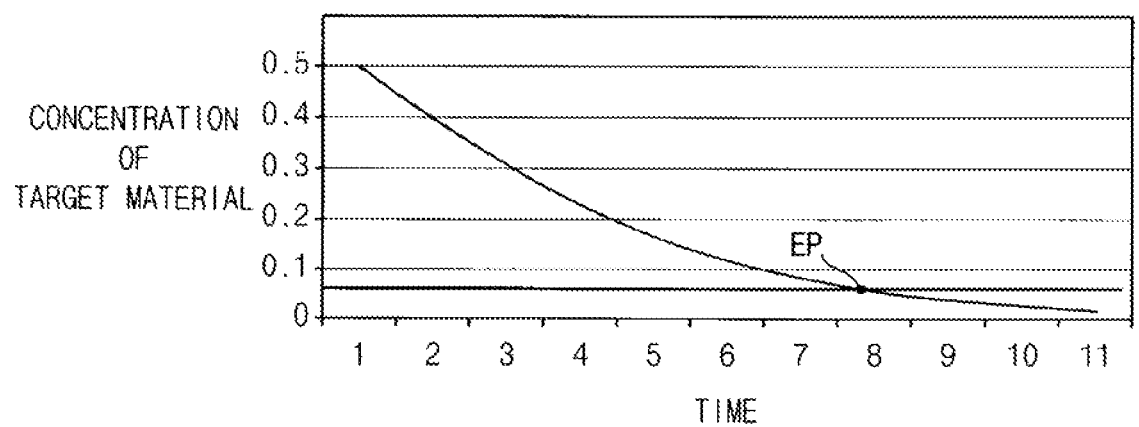

FIG. 5 is a graph illustrating concentration changes of a target material detected by the detection unit in FIG. 4 versus a process time.

Referring to FIG. 5, a relative concentration of the target material detected by the detection unit in FIG. 4 may decrease over time. Accordingly, a time when a relative concentration of the target material decreases to a predetermined concentration (for example, 0.05%) may be determined as an end point (EP) of the process.

Thus, even though a concentration of a target material in a discharged fluid is too small to detect, a relative concentration of a target liquid with respect to a reference liquid may be detected, to check the progress of the process and determine the end point of the supercritical fluid process.

Referring to FIG. 3B, a concentration of the target material detected by the detection unit in FIG. 2 may increase with time. For example, as the process proceeds, a discharged supercritical fluid (e.g., a gas supplied to the process chamber) as a target material may increase while a discharged reactant decreases. Accordingly, a time when a normalized concentration of the target material increases to a predetermined concentration (for example, 0.95%) may be determined as an end point of the process.

Thus, a concentration of a target material in the discharged fluid may be detected and analyzed in real time, to check the progress of the process and determine the end point of the supercritical fluid process.

Figure 6:
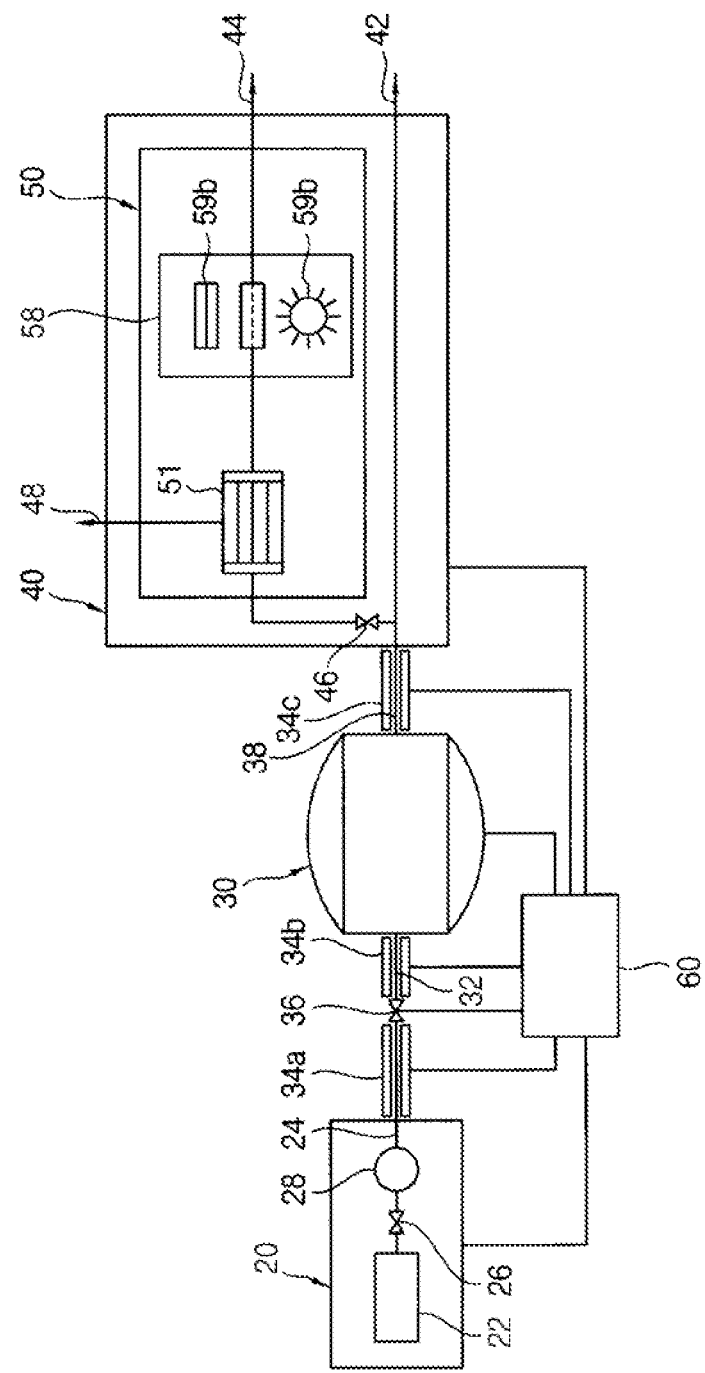

FIG. 6 is a block diagram illustrating a substrate processing system 12 in accordance with an exemplary embodiment of the present disclosure. FIG. 6 is substantially the same as FIG. 4, with the exception of the detection unit. Thus, the same reference numerals will be used to refer to the same or like elements as those described with reference to FIG. 4 and any further explanation thereof will be omitted.

Referring to FIG. 6, a detection unit 50 of a substrate processing system 12 according to an exemplary embodiment may include a condenser 51 for condensing the discharged fluid to a liquid phase and a photodetector 58 for detecting a concentration of a target material (target liquid) included in the discharged fluid in a liquid phase.

The condenser 51 may be disposed at the auxiliary discharge pipe 44 to condense the fluid discharged from the process chamber 30 to a liquid phase. The fluid of a liquid phase may be circulated from the condenser 51 to the supply unit 20 of the system through a circulation pipe 48.

In an exemplary embodiment, the photodetector 58 may detect a concentration of a target liquid discharged from the condenser 51. The photodetector may include a light source 59a and a light receiving sensor 59b.

In particular, the light source 59a may emit a light, which may pass through the target liquid discharged from the condenser 51, and then may be incident on the light receiving sensor 59b. The intensity of the light incident on the light receiving sensor 59b may vary according to the progress of the process. For example, as the process proceeds, a concentration of the target material in the discharged fluid may decrease and thus the intensity of the light incident on the light receiving sensor 59b may increase. Accordingly, a time when the intensity of the light increases to a predetermined intensity may be determined as an end point of the process.

Thus, a concentration of a target material in the discharged fluid may be detected in real time using a photodetector, to check the progress of the process and determine the end point of the supercritical fluid process.

Figure 7:
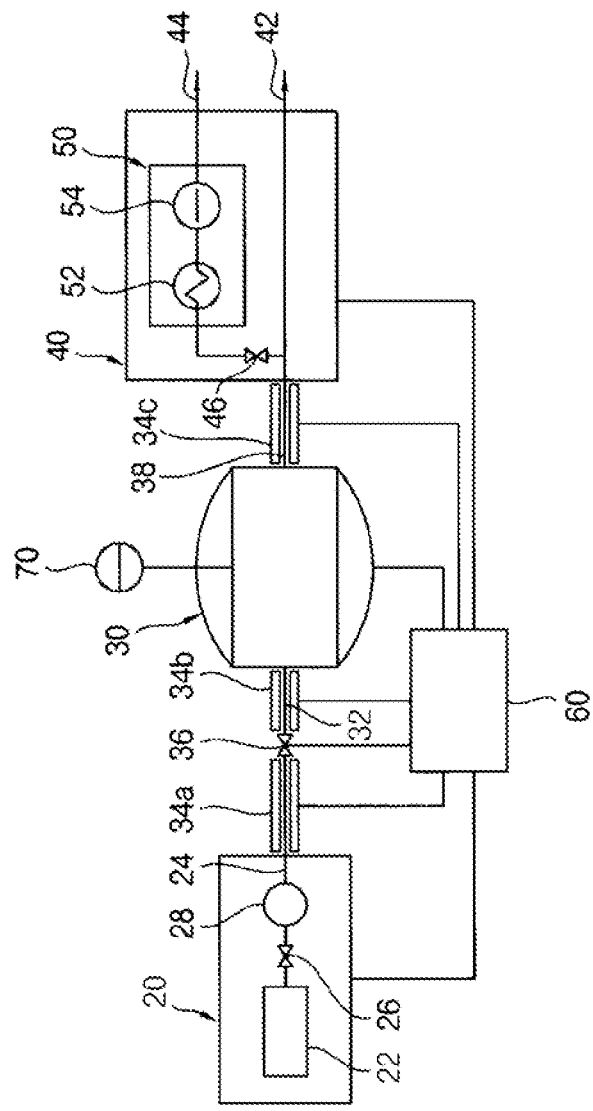

FIG. 7 is a block diagram illustrating a substrate processing system 13 in accordance with an exemplary embodiment of the present disclosure. FIG. 7 is substantially the same as FIG. 2, with the exception of the detection unit. Thus, the same reference numerals will be used to refer to the same or like elements as those described with reference to FIG. 4 and any further explanation thereof will be omitted.

Referring to FIG. 7, a substrate processing system 13 according to an exemplary embodiment of the present disclosure may further include a chamber detector 70 to directly detect a concentration of a target material in the process chamber 30.

Accordingly, the chamber detector 70 may be used together with the detection unit 50 disposed in the discharge unit 40 to check the progress of the process and determine the end point of the supercritical fluid process.

Hereinafter, an exemplary method of manufacturing a semiconductor device using the substrate processing method in FIG. 1 will be explained in detail.

FIGS. 8 to 13 are cross-sectional views illustrating a method of manufacturing a semiconductor device using a substrate process method in accordance with an exemplary embodiment of the present disclosure.

Figure 8:
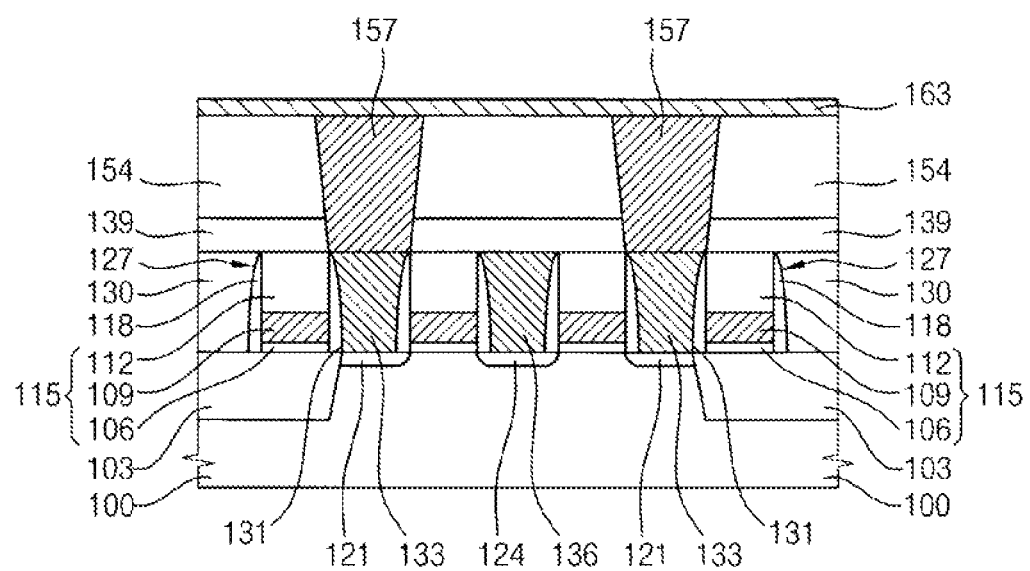

Referring to FIG. 8, an isolation process may be performed on a semiconductor substrate 100 to form an isolation layer 103 defining an active region and a field region in the semiconductor substrate 100.

A thermal oxidation process or a chemical vapor deposition process may be performed on the semiconductor substrate 100 including the isolation layer 103 formed therein, to form a gate oxide layer 106 of a gate structure 115. The gate structure 115 may further include a gate conductive layer pattern 109 and a first hard mask pattern 112 formed on the gate oxide layer 106. The gate structure 115 may have a linear shape extending in a first direction.

After a silicon nitride layer is formed on the semiconductor substrate 100 including gate structures 115 formed thereon, the silicon nitride layer may be anisotropically etched to form a gate spacer 118 on a sidewall of each of the gate structures 115.

Impurities may be doped into the semiconductor substrate 100 using the gate structures 115 as an ion implantation mask, and the substrate 100 may be thermally treated to form source/drain regions 124, 121 in the semiconductor substrate 100.

These processes may be performed to faun transistors in the semiconductor substrate 100. A gate electrode having a linear shape may be used as a word line. The source/drain region 124, 121 may be defined by an operation mode of the transistor. However, hereinafter, a first region electrically connected to a bit line may be referred to as a source region 124 and a second region electrically connected to a capacitor may be referred to as a drain region 121.

A first insulation interlayer 130 may be formed on the transistors on the semiconductor substrate 100. The first insulation interlayer 130 may include silicon oxide. The first insulation interlayer 130 may be partially etched to form first contact holes (not illustrated) that expose the source/drain regions. Then, the first contact holes may be filled with conductive material to form pad contacts 133, 136.

A second insulation interlayer 139 may be formed on the first insulation interlayer 130. The second insulation interlayer 139 may be partially etched to form second contact hole (not illustrated) exposing the pad contact 136 connected to the source region 124. A conducive layer may be formed on the second insulation interlayer 139 to fill the second contact hole to form a bit line (not illustrated) and a bit line contact (not illustrated).

A third insulation interlayer 154 may be formed on the second insulation interlayer 139 to fill the bit line. The third insulation interlayer 154 and the second insulation interlayer 139 may be partially etched to form third contact holes (not illustrated) exposing the pad contact 133 connected to the drain region 121. The third contact holes may be filled with conductive material to form a storage node contact 157. Then, although it is not illustrated, a pad pattern may be further formed on the storage node contact 157 to define a storage node electrode forming region.

Next, an etch stop layer 163 may be formed on the storage node contact 157 and the third insulation layer 154. The etch stop layer 163 may include silicon nitride.

Figure 9:
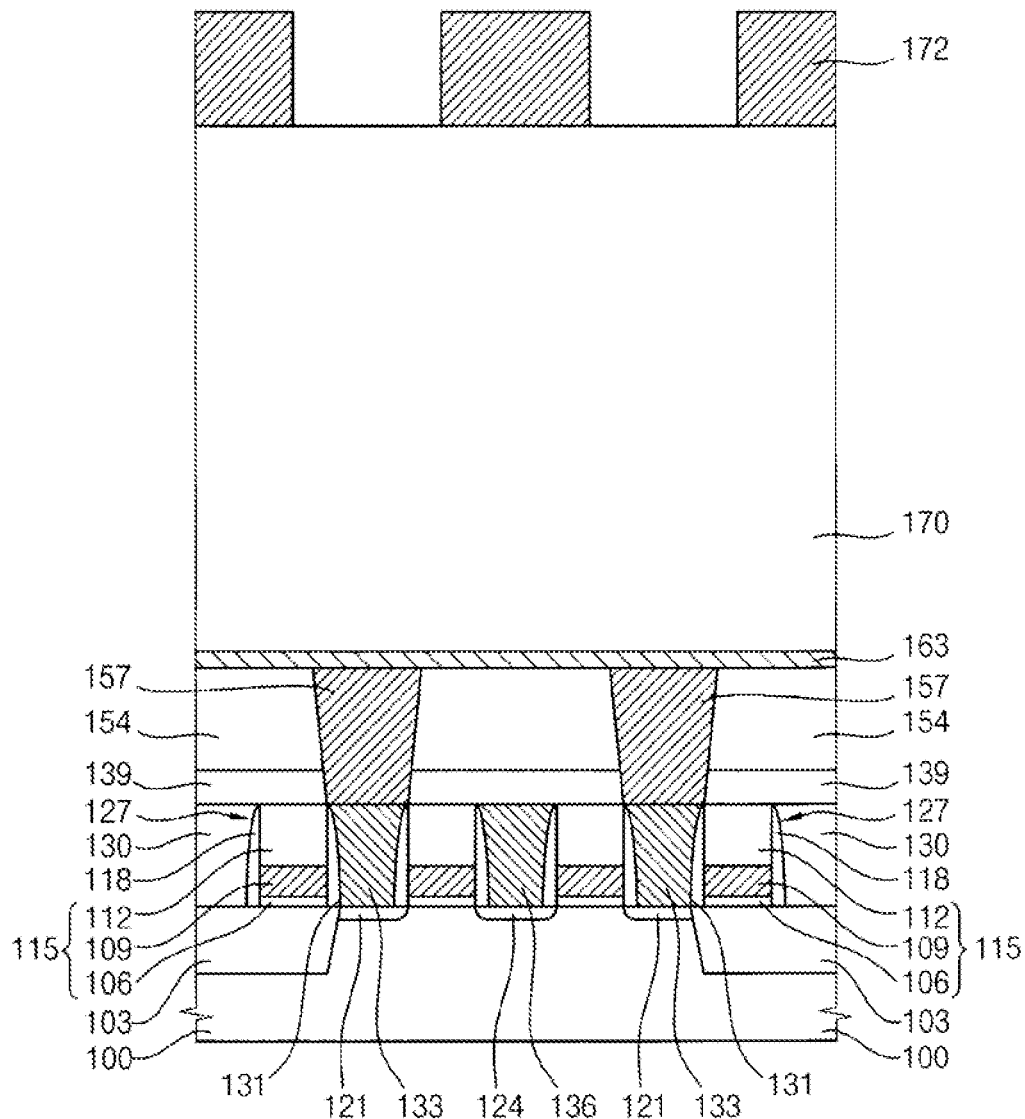

Referring to FIG. 9, a mold layer 170 may be formed on the etch stop layer 163. The mold layer 170 may be formed using silicon oxide. For example, the mold layer 170 may include BPSG or TEOS.

The mold layer 170 may be used to mold a cylindrical storage electrode. The height of the cylindrical storage electrode may depend on the thickness of the mold layer 170. Accordingly, the thickness of the mold layer 170 may be determined according to a desired capacitance.

A second hard mask pattern 172 may be formed on the mold layer 170 to expose a region for a storage electrode to be formed. The second hard mask pattern 172 may be formed using a material having an etch selectivity with respect to the mold layer. For example, the second hard mask pattern 178 may include polysilicon.

Figure 10:
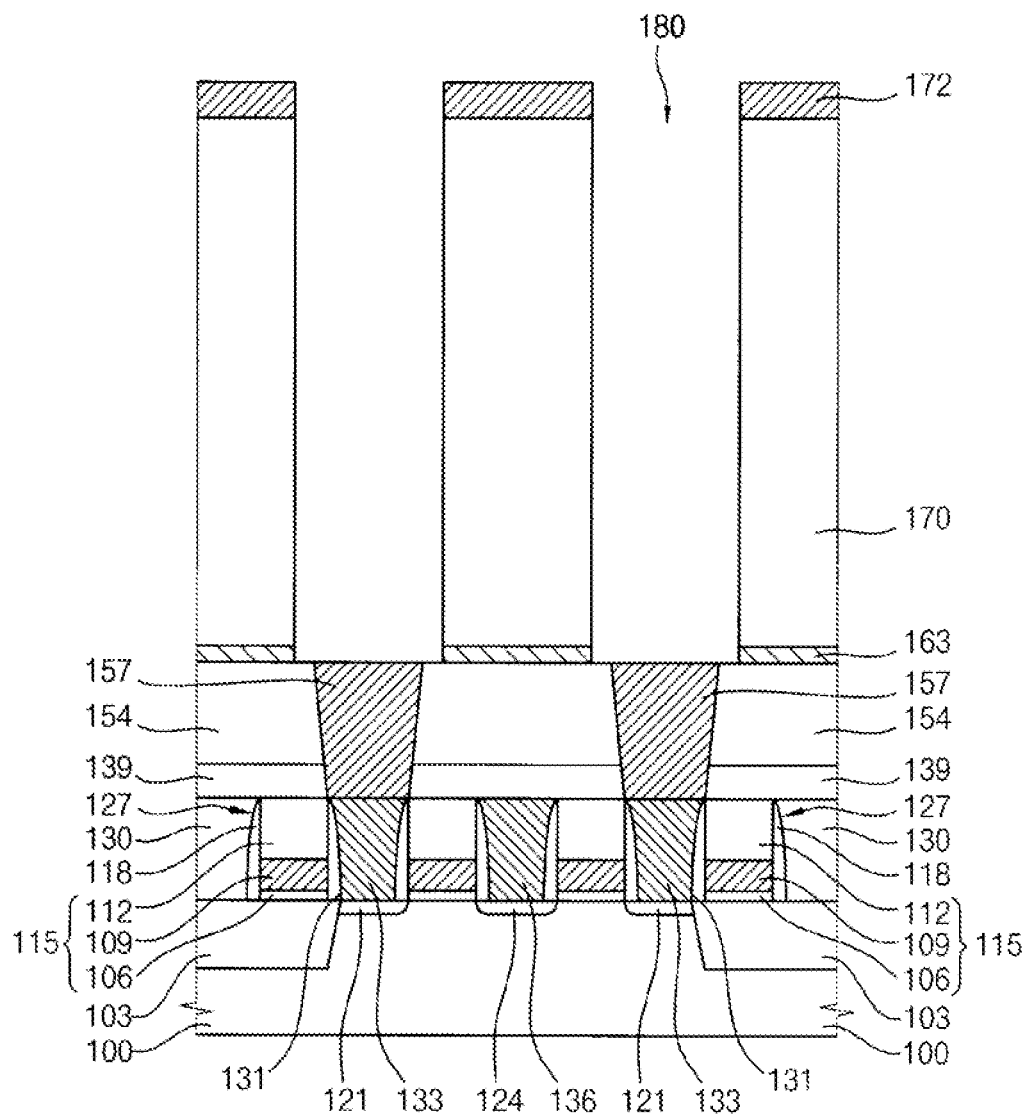

Referring to FIG. 10, the mold layer 170 may be etched using the second hard mask pattern 172 as an etching mask, to form a preliminary opening (not illustrated) that exposes an upper surface of the storage node contact 157.

The preliminary opening may be cleaned to form an opening 180 that is used to form a cylindrical storage electrode. A cleaning process may be performed using a cleaning solution.

Figure 11:
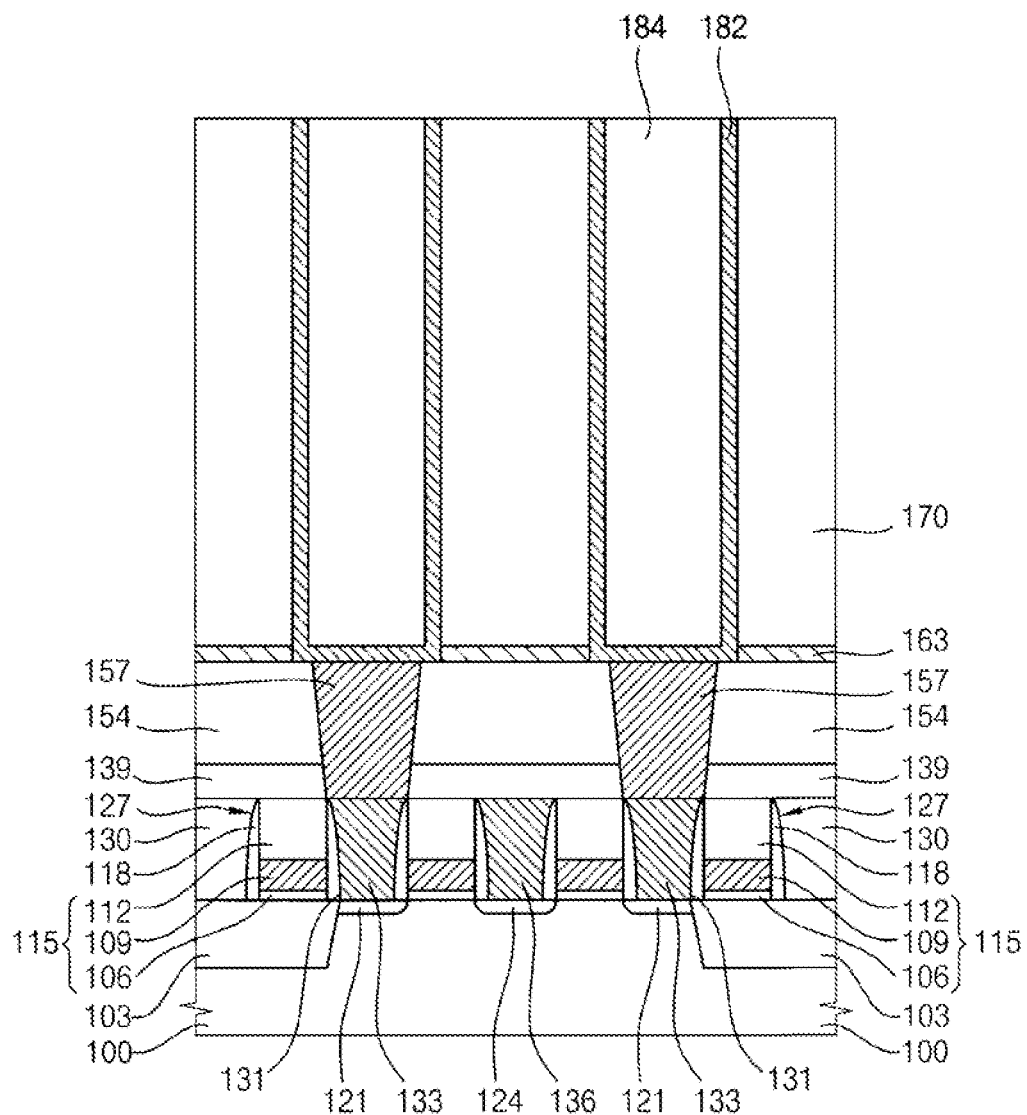

Referring to FIG. 11, a conductive layer (not illustrated) for a storage node electrode may be formed on sidewalls and a lower face of the opening 180 and an upper surface of the second hard mask pattern (not illustrated). The conductive layer for a storage node electrode may include polysilicon doped with impurities.

A sacrificial layer 184 may be formed on the conductive layer for a storage node electrode to completely fill the opening 180. The sacrificial layer 184 may be formed using silicon oxide.

A planarization process may be performed to remove the conductive layer for the storage node electrode 157 and the second hard mask pattern on the upper surface of the mold layer 170, to form a storage electrode 182 in the opening 180.

Figure 12:
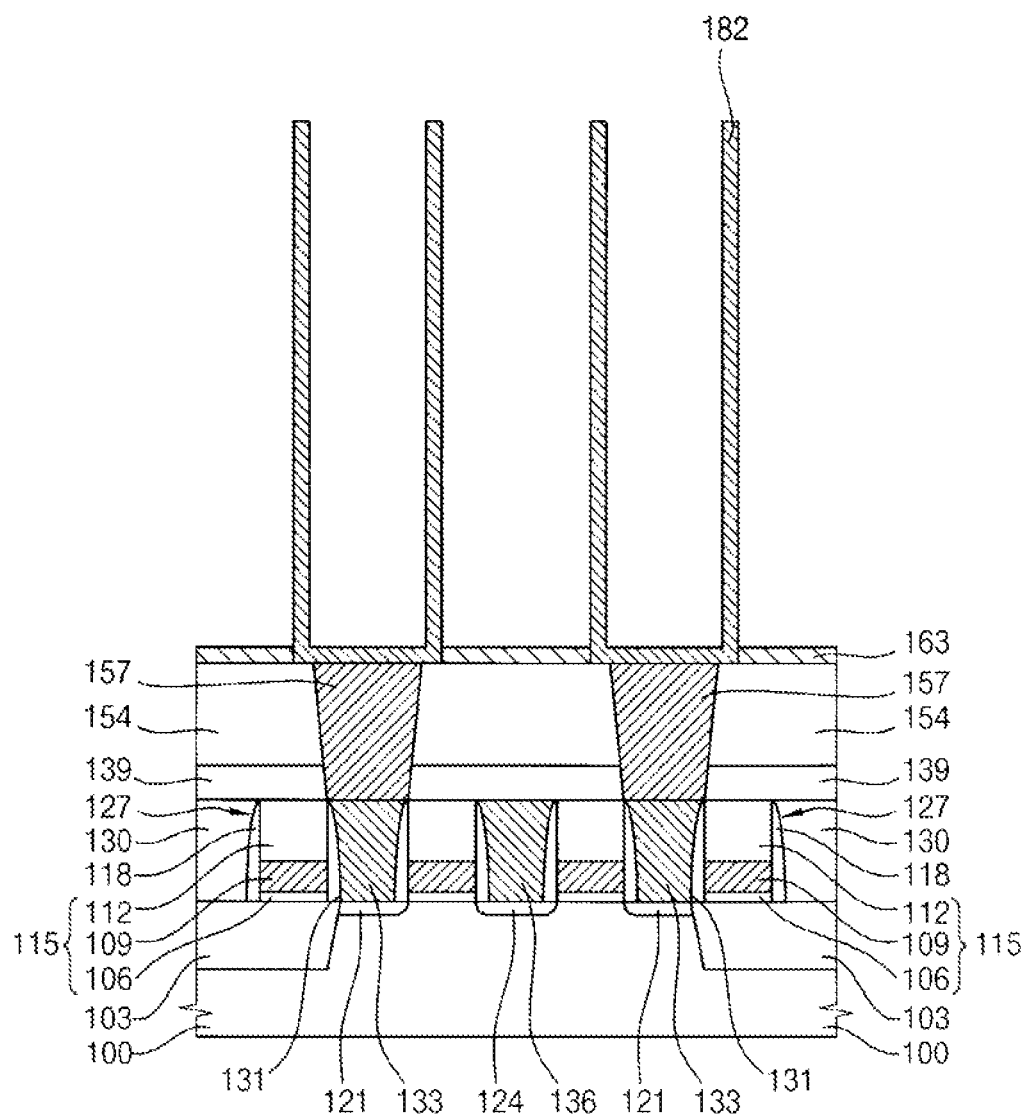

Referring to FIG. 12, after forming the storage electrode 182, an etching process may be performed to remove the mold layer 170 and the sacrificial layer 184 (see FIG. 11).

In an exemplary embodiment, after the mold layer 170 and the sacrificial layer 184 are removed by the etching process to expose the storage electrode 182, a cleaning process and/or a drying process may be performed to remove byproducts of the etching process.

In an exemplary embodiment, after a material layer such as the mold layer and the sacrificial layer are etched and cleaned, the semiconductor substrate may be dried using a supercritical fluid.

For example, after the etching process is performed, byproducts of the etching process may be removed using a cleaning solution such as DI water or alcohol such as IPA. After the cleaning process is performed, a drying process may be performed to remove residual IPA. After the substrate is loaded into a process chamber of a substrate process chamber according to an exemplary embodiment, the substrate may be dried using supercritical carbon dioxide.

As the drying process proceeds, the supercritical carbon dioxide with IPA may be discharged from the process chamber. The IPA may be a target material indicative of the progress of the supercritical drying process. Accordingly, a real-time concentration of the target material included in the fluid discharged from the process chamber may be detected to determine an end point of the supercritical drying process based on the detected concentration.

In another exemplary embodiment, after a material layer such as the mold layer and the sacrificial layer are etched, the semiconductor substrate may be cleaned using a supercritical fluid. For example, the semiconductor substrate may be cleaned using a supercritical carbon dioxide with surfactant dissolved therein.

As the cleaning process proceeds, the supercritical carbon dioxide with surfactant may be discharged from the process chamber. The surfactant may be a target material indicative of the progress of the supercritical cleaning process. Accordingly, a real-time concentration of the target material included in the fluid discharged from the process chamber may be detected to determine an end point of the supercritical cleaning process based on the detected concentration.

In still another exemplary embodiment, a material layer such as the mold layer and the sacrificial layer may be etched by a supercritical etching process. For example, the material layer may be etched using a supercritical fluid with hydrogen fluoride (HF) included therein.

As the etching process proceeds, the supercritical fluid with byproducts of the etching process may be discharged from the process chamber. The byproduct of the etching process may include a target material indicative of the progress of the supercritical cleaning process. Accordingly, a real-time concentration of the target material included in the fluid discharged from the process chamber may be detected to determine an end point of the supercritical etching process based on the detected concentration.

Alternatively, the supercritical fluid itself may be a target material. As the etching process proceeds, a concentration of supercritical carbon dioxide may increase. Accordingly, a real-time concentration of the discharged fluid from the process chamber may be detected to determine an end point of the supercritical fluid process based on the detected concentration.

Figure 13:
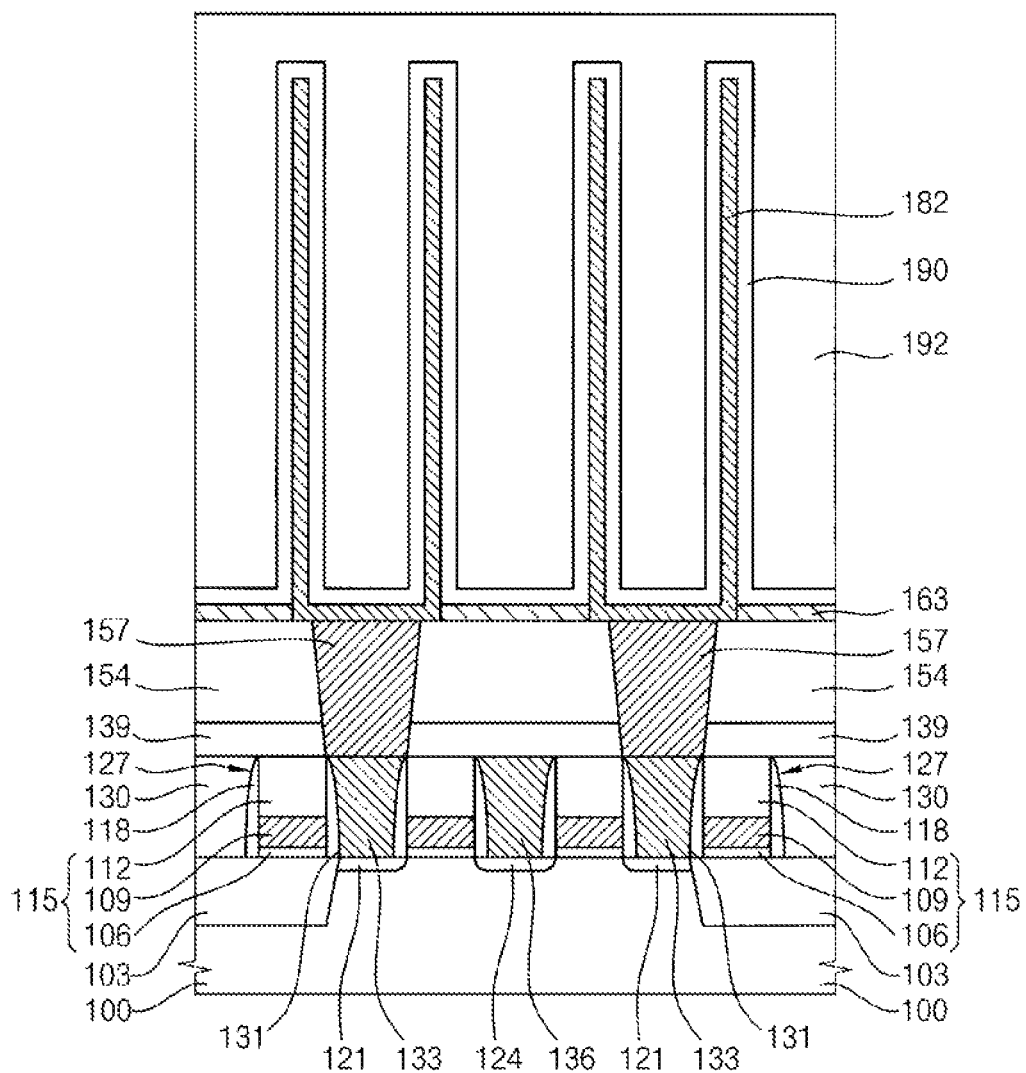

Referring to FIG. 13, a dielectric layer 190 may be formed on a surface of the storage electrode 182. A plate electrode 192 may be formed on the dielectric layer 190. The above-mentioned processes may be performed to manufacture a semiconductor device including a storage electrode.

As mentioned above, in a method of processing a substrate in accordance with exemplary embodiments of the present disclosure, a supercritical fluid process may be performed on a substrate using a supercritical fluid in a process chamber. As the supercritical fluid process proceeds, the supercritical fluid may be discharged from the process chamber. A real-time concentration of a target material included in the fluid discharged from the process chamber may be detected to determine an end point of the supercritical fluid process based on the detected concentration of the target material.

Accordingly, a concentration of a target material in the discharged fluid may be detected and analyzed in real time, to check the progress of the process and determine the end point of the supercritical fluid process. After determining the end point of the supercritical fluid process, a system including the process chamber may be controlled to complete the supercritical fluid process.

The foregoing description is illustrative of exemplary embodiments and is not to be construed as limiting thereof. Although a few exemplary embodiments have been described, those skilled in the art will readily appreciate that many modifications are possible without materially departing from the novel teachings and advantages of the present disclosure. Accordingly, all such modifications are intended to be included within the scope of exemplary embodiments as defined in the claims. In the claims, means-plus-function clauses are intended to cover the structures described herein as performing the recited function and structural equivalents. Therefore, it is to be understood that the foregoing is illustrative of various exemplary embodiments and is not to be construed as limited to specific exemplary embodiments disclosed, and that modifications to exemplary embodiments are intended to be included within the scope of the appended claims.

What is claimed is:

1. A supercritical fluid method for manufacturing a semiconductor device, comprising:
    loading a semiconductor substrate having a material layer formed thereon into a process chamber;
    supplying a supercritical fluid into the process chamber;
    performing at least one of an etching process, a cleaning process and a drying process in the process chamber;
    discharging the supercritical fluid from the process chamber during a supercritical fluid process; and
    detecting a concentration of a target material included in the supercritical fluid discharged from the process chamber during the supercritical fluid process,
    wherein detecting the concentration of the target material comprises:
    heating the supercritical fluid discharged from the process chamber to maintain the supercritical fluid in a gas phase; and
    detecting the concentration of the target material in the gas phase included in the supercritical fluid discharged from the process chamber,
    wherein the at least one of the etching process, the cleaning process and the drying process is performed using the supercritical fluid supplied into the process chamber.

2. The method of claim 1, wherein the supercritical fluid is used in the etching process in the process chamber for forming the semiconductor device and wherein the target material includes an etching material including a fluoride used in the etching process.

3. The method of claim 1, wherein the supercritical fluid is used in the cleaning process for removing the byproducts for forming the semiconductor device and wherein the target material includes one of de-ionized water, a surfactant or an alcohol used in the cleaning process.

4. The method of claim 1, wherein the supercritical fluid is used to dry the semiconductor substrate after the etching process and the cleaning process have been performed.

5. The method of claim 1, wherein the supercritical fluid includes carbon dioxide ($CO_2$).

6. A supercritical fluid method for manufacturing a semiconductor device, comprising:
    loading a semiconductor substrate having a material layer formed thereon into a process chamber;
    supplying a supercritical fluid into the process chamber;
    performing at least one of an etching process, a cleaning process and a drying process in the process chamber;
    discharging the supercritical fluid from the process chamber during a supercritical fluid process; and
    detecting a concentration of a target material included in the supercritical fluid discharged from the process chamber during the supercritical fluid process, wherein detecting the concentration of the target material comprises:
    condensing the supercritical fluid discharged from the process chamber to a liquid phase; and
    detecting the concentration of the target material in the liquid phase included in the supercritical fluid discharged from the process chamber,
    wherein the at least one of the etching process, the cleaning process and the drying process is performed using the supercritical fluid supplied into the process chamber.

7. The method of claim 6, wherein detecting the concentration of the target liquid comprises:
    mixing the target material in the liquid phase with a reference liquid; and
    detecting a relative concentration of the target material in the liquid phase with respect to the reference liquid.

8. The method of claim 5, wherein the supercritical fluid is used in the etching process in the process chamber for forming the semiconductor device and wherein the target material includes an etching material including a fluoride used in the etching process.

9. The method of claim 6, wherein the supercritical fluid is used in the cleaning process for removing the byproducts for forming the semiconductor device and wherein the target material includes one of de-ionized water, a surfactant or an alcohol used in the cleaning process.

10. The method of claim 6, wherein the supercritical fluid is used to dry the semiconductor substrate after the etching process and the cleaning process have been performed.

11. The method of claim 6, wherein the supercritical fluid includes carbon dioxide ($CO_2$).

* * * * *